US009677308B1

(12) United States Patent
Chen et al.

(10) Patent No.: US 9,677,308 B1
(45) Date of Patent: Jun. 13, 2017

(54) HINGE HAVING MOVABLE SHAFT

(71) Applicant: LIANHONG ART CO., LTD., Taoyuan (TW)

(72) Inventors: Chia-Hui Chen, Taoyuan (TW); Tzu-Yu Lin, Taoyuan (TW); Chiao-Fang Chang, Taoyuan (TW)

(73) Assignee: LIANHONG ART CO., LTD., Taoyuan (TW)

( * ) Notice: Subject to any disclaimer, the term of this patent is extended or adjusted under 35 U.S.C. 154(b) by 0 days.

(21) Appl. No.: 15/240,455

(22) Filed: Aug. 18, 2016

(51) Int. Cl.
*E05D 3/18* (2006.01)
*E05D 3/12* (2006.01)
*E05D 3/06* (2006.01)
*G06F 1/16* (2006.01)
*H05K 5/02* (2006.01)

(52) U.S. Cl.
CPC ........... *E05D 3/18* (2013.01); *E05D 3/06* (2013.01); *E05D 3/122* (2013.01); *G06F 1/1681* (2013.01); *H05K 5/0226* (2013.01); *E05Y 2900/606* (2013.01); *Y10T 16/541* (2015.01)

(58) Field of Classification Search
CPC .. E05D 3/18; E05D 3/122; E05D 3/06; G06F 1/1681; H05K 5/0226; E05Y 2900/606; H04M 1/022; Y10T 16/541; Y10T 16/547; Y10T 16/54
USPC ........ 16/354, 366, 319; 361/679.27, 679.06; 379/433.13; 455/575.3
See application file for complete search history.

(56) References Cited

U.S. PATENT DOCUMENTS

| | | | | |
|---|---|---|---|---|
| 7,832,056 B2* | 11/2010 | Kuwajima | ............ | H04M 1/022 16/282 |
| 8,104,144 B2* | 1/2012 | Wang | .................... | G06F 1/1681 16/354 |
| 8,205,305 B2* | 6/2012 | Wang | .................... | G06F 1/1681 16/354 |
| 8,474,101 B2* | 7/2013 | Wang | .................... | G06F 1/1681 16/354 |
| 8,578,561 B2* | 11/2013 | Chuang | ................. | G06F 1/1681 16/354 |
| 9,127,490 B2* | 9/2015 | Chen | ........................ | E05D 3/122 |
| 2009/0070961 A1* | 3/2009 | Chung | .................... | E05D 3/122 16/354 |
| 2015/0159413 A1* | 6/2015 | Chen | ........................ | E05D 3/122 16/342 |
| 2015/0267450 A1* | 9/2015 | Chiang | ................. | G06F 1/1681 16/354 |
| 2015/0342068 A1* | 11/2015 | Su | ......................... | G06F 1/1681 16/354 |
| 2016/0011632 A1* | 1/2016 | Hsu | ......................... | E05D 3/122 16/354 |
| 2016/0060927 A1* | 3/2016 | Xu | .......................... | E05D 3/122 361/679.55 |

(Continued)

*Primary Examiner* — William Miller
(74) *Attorney, Agent, or Firm* — Guice Patents PLLC

(57) ABSTRACT

A hinge includes at least one shaft set including a first shaft and a second shaft. The first shaft and the second shaft extend through a first guiding member and a second guiding member. A guiding base is disposed between the first shaft and the second shaft. The first shaft and the second shaft connect to an upper plate and a lower plate. The upper plate and the lower plate are connected to two rotatable parts of an electronic device. The first shaft and the second shaft moves relatively along with the rotation of the two rotatable parts of the electronic device.

12 Claims, 7 Drawing Sheets

(56) References Cited

U.S. PATENT DOCUMENTS

2016/0187934 A1* 6/2016 Lee ...................... G06F 1/1618
                                                      361/679.56

* cited by examiner

HINGE HAVING MOVABLE SHAFT

BACKGROUND OF THE INVENTION

Field of the Invention

The invention relates to a hinge having movable shaft and equipped to an electronic device and having a plurality movable shafts moving with rotation of the electronic device to prevent a display of the electronic device from damaging or breaking during the rotation.

Description of the Related Art

As IT industry rapidly develops, electronic information processing device develops from desktops to portable electron equipment, such as portable laptops and even tablets, smartphone or wearable devices. Display devices of these electronic devices also develops from rigid display to flexible display. The flexible display includes a glass substrate coated with a flexible plastic layer and has bendable, fordable and extensile characteristics. The flexible display is applied to hand phones, tablets and wearable devices.

Conventional hinges for these electronic devices have different shafts mounted to display and main body respectively. The display and the main body rotate simultaneously through a transmission mechanism. The conventional hinges are often fixed. However, when the electronic devices are opened or closed, the shafts may move. The movement of the shafts may cause damages or deformation of the display.

BRIEF SUMMARY OF THE INVENTION

An object of the invention is to provide a hinge having movable shafts. The movable shafts are mounted to a display and a main body of an electronic device moving relative to each other to prevent deformation or damage of display when the display and the main body of the electronic device rotate relative to each other. The invention provides a hinge. The hinge in accordance with an exemplary embodiment of the invention includes a first shaft mounted to an upper plate and comprising a first gear and a first rod extending from the first gear; a second shaft mounted to a lower plate and comprising a second gear and a second rod extending from the second gear; a first guiding member, through which the first rod and the second rod extending, comprising a first up-inclined groove having a predetermined length and a first down-inclined groove having a predetermined length; a second guiding member disposed on the first rod and the second rod and comprising a second up-inclined groove having a predetermined length and a second down-inclined groove having a predetermined length; a guiding base disposed between the first shaft and the second shaft, mounted to the first guiding member and the second guiding member and comprising a first row of teeth engaging the first gear and a second row of teeth engaging the second gear, wherein the first rod extends through the first up-inclined groove and the second up-inclined groove to connect the upper plate, and the second rod extends through the first down-inclined groove and the second down-inclined groove to connect the lower plate.

In another exemplary embodiment, the first row of teeth has a slope identical to a slope of the first up-inclined groove and the second up-inclined groove, and the second row of teeth has a slope identical to a slope of the first down-inclined groove and the second down-inclined groove.

In yet another exemplary embodiment, the guiding base comprises two extending rods, and the first guiding member comprises a hole into which the extending rod is inserted, and the second guiding member comprises a hole into which the extending rod is inserted.

In another exemplary embodiment, the upper plate comprises two plates, and the lower plate comprises two plates, and each of the plates comprises a hole and an extending portion having a through hole, and the first rod is inserted into the through holes of the upper plate, and the second rod is inserted into the through holes of the lower plate.

In yet another exemplary embodiment, the upper plate comprises two plates, and the lower plate comprises two plates, and each of the plates comprises a hole and an extending portion having a through hole, and the first rod is inserted into the through holes of the upper plate, and the second rod is inserted into the through holes of the lower plate.

In another exemplary embodiment, the first shaft further comprises an extending rod on which torque elastic members are mounted, and the second shaft further comprises an extending rod on which torque elastic members are mounted.

In yet another exemplary embodiment, the hinge includes a plurality of shaft sets, and each shaft set includes the first shaft and the second shaft.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
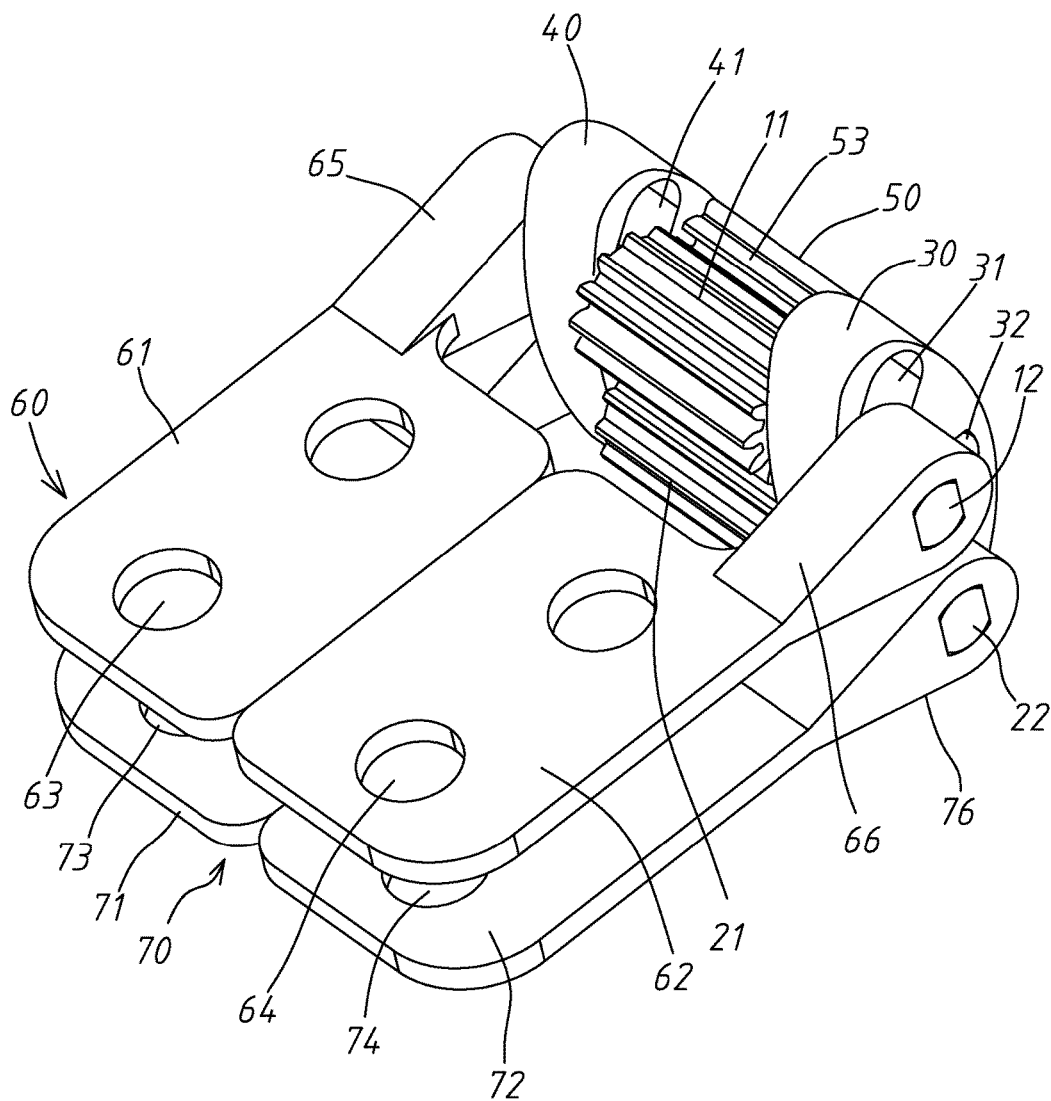
FIG. 1 is a perspective view of the first embodiment of a hinge of the invention.
Figure 2:
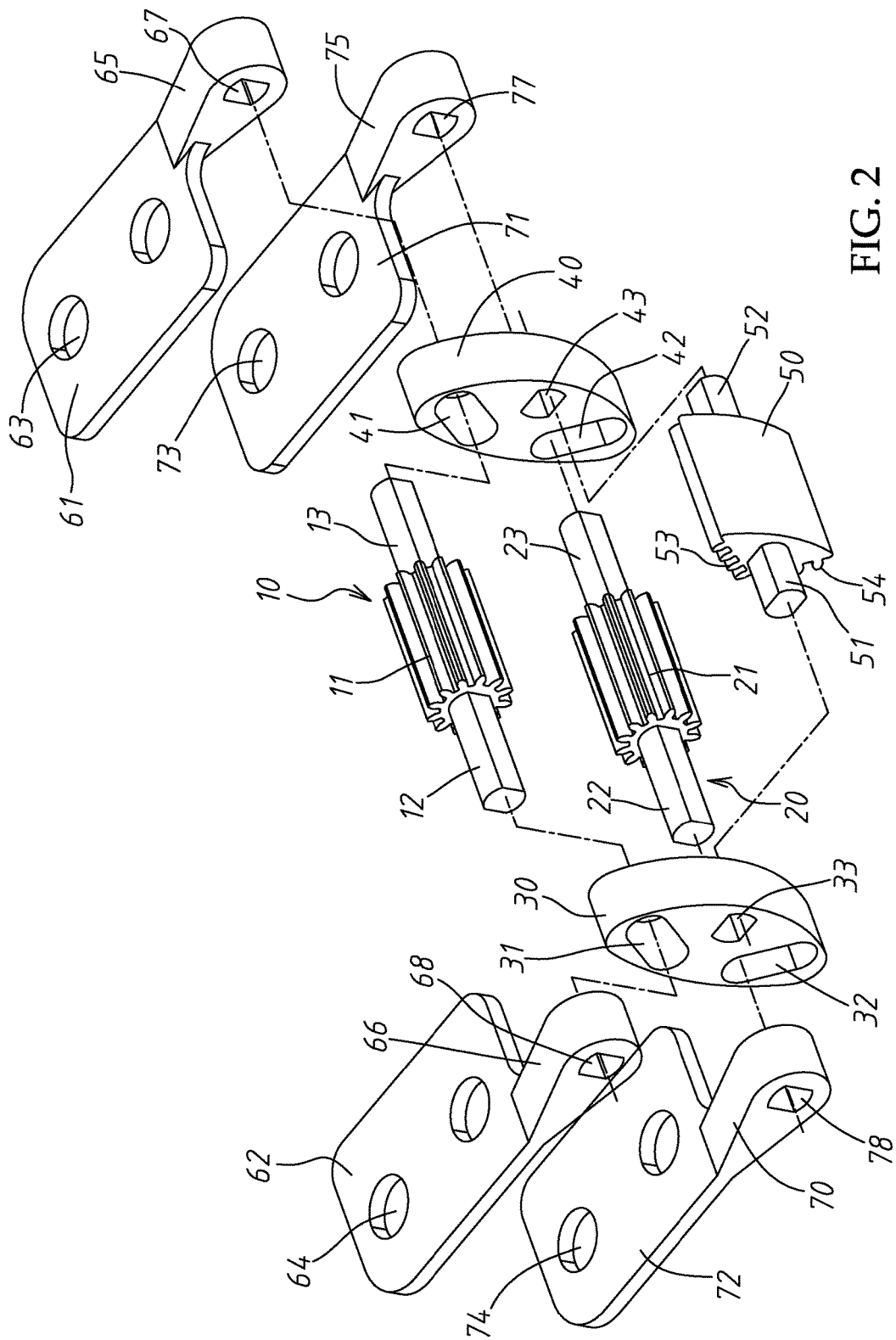
FIG. 2 is an exploded view of the hinge of FIG. 1.

Referring to FIGS. 1 and 2, an embodiment of a hinge of the invention includes a first shaft 10 and a second shaft 20. The first shaft 10 and the second shaft 20 extend through a first guiding member 30 and a second guiding member 40. A guiding base 50 is disposed between the first shaft 10 and the second shaft 20. The first shaft 10 is connected to a upper plate 60, and the second shaft 20 is connected to a lower plate 70. The upper plate 60 and the lower plate 70 are fixed to two parts of an electronic device which are moved to become opened or closed, such as a display and a main body of an electronic device (not shown).

A first gear 11 is formed on a central position of the first shaft 10, and a second gear 21 is disposed on the second shaft 20. The first shaft 10 has two first rods 12 and 13 extending from two opposite sides of the first gear 11. The second shaft 20 has two second rods 22 and 23 extending from two opposite sides of the second gear 21. The first guiding member 30 has an up-inclined groove 31 and a down-inclined groove 32. The second guiding member 40 has an up-inclined groove 41 and a down-inclined groove 42. The up-inclined grooves 31 and 41 have a predetermined length. The down-inclined grooves 32 and 42 have a predetermined length. The first rods 12 and 13 extend through the up-inclined grooves 31 and 41 respectively to connect the upper plate 60. The second rods 22 and 23 extend through the down-inclined grooves 32 and 42 respectively to connect the lower plate 70.

The guiding base 50 position the first shaft 10 and the second shaft 20 to the first guiding member 30 and the second guiding member 40 respectively. The guiding base 50 has two extending rods 51 and 52 inserted into holes 33 and 34 which are formed on the first guiding member 30 and the second guiding member 40. The guiding base 50 has a first row of teeth 53 and a second row of teeth 54. The first row of teeth 53 engaging the first gear 11 has the same slope as the up-inclined grooves 31 and 41. The second row of teeth 54 engaging the second gear 21 has the same slope as the down-inclined grooves 32 and 42.

In this embodiment, the upper plate 60 includes two plates 61 and 62, and the lower plates 70 includes two plates 71 and 72. The plate 61 has a hole 63 and an extending portion 65, and the plate 62 has a hole 64 and an extending portion 66. The plate 71 has a hole 73 and an extending portion 75, and the plate 72 has a hole 74 and an extending portion 76. The extending portion 65 has a through hole 67 through which the first rod extends. The extending portion 66 has a through hole 68 through which the first rod 13 extends. The extending portion 75 has a through hole 77 through which the first rod 22 extends. The extending portion 76 has a through hole 78 through which the first rod 23 extends.

Figure 3:
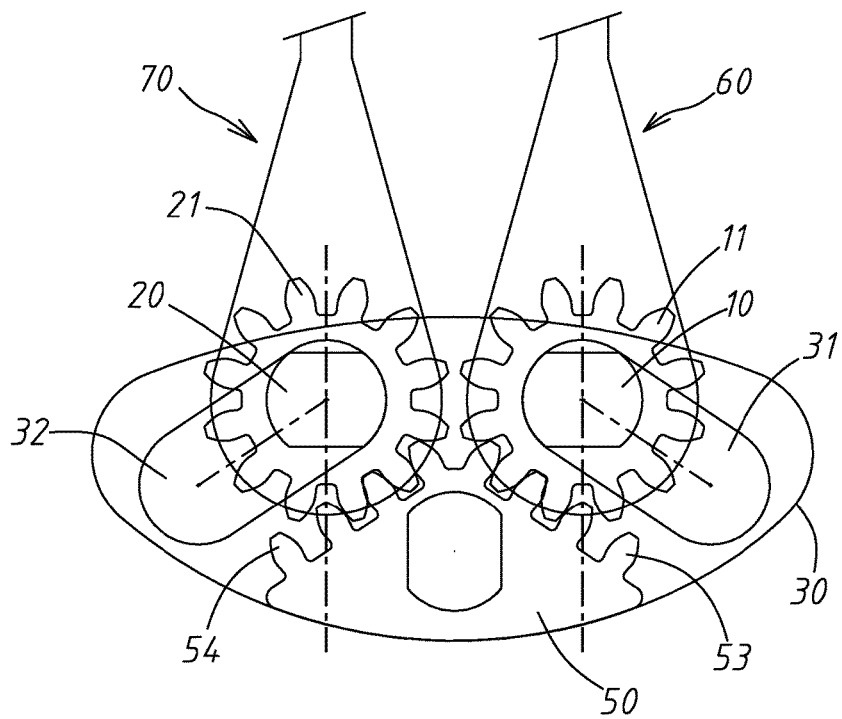
FIG. 3 depicts the hinge of FIG. 1 in a closed state.
Figure 4:
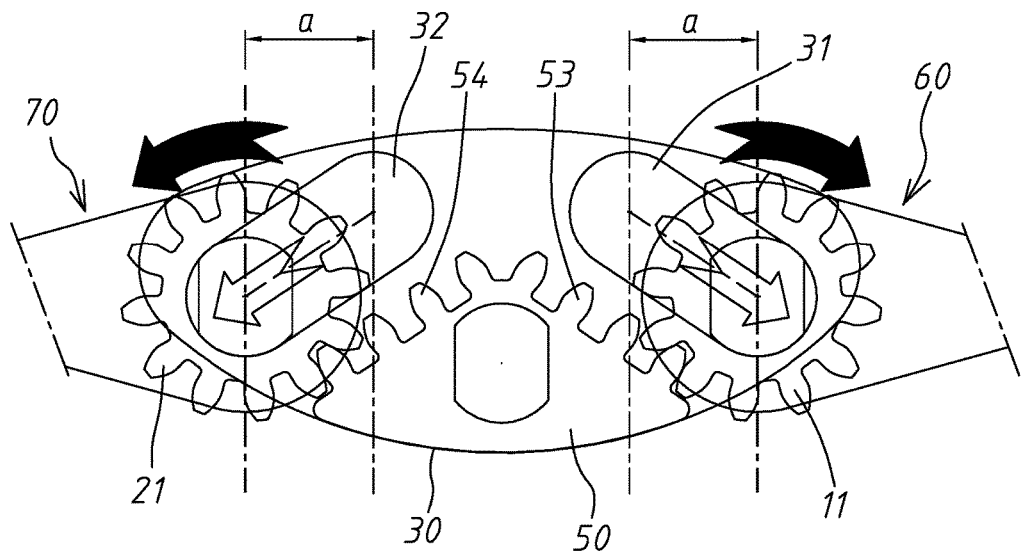
FIG. 4 depicts the hinge of FIG. 1 in an opened state.

Referring to FIGS. 2 and 3, when the hinge of the invention is in a closed state, the first rods 12 and 13 abut inner ends of the up-inclined grooves 31 and 41 respectively, and the second rods 22 and 23 abut inner ends of the down-inclined grooves 32 and 42. When the upper plate 60 and the lower plate 70 are moved away as shown in FIG. 4 during the opening of the electronic device, the first gear 11 and the second gear 21 move along the first row of teeth 53 and the second row of teeth 54, whereby the first shaft 10 moves along the up-inclined grooves 31 and 41 until the first shaft 10 reaches outer ends of the up-inclined grooves 31 and 41, and the second shaft 20 moves along the down-inclined grooves 32 and 42 until the second shaft 20 reach outer ends of the down-inclined grooves 32 and 42. The outer ends of the up-inclined grooves 31 and 41 and the down-inclined grooves 32 and 42 define the maximal open angle. At this time, the first shaft 10 and the second shaft 20 mutually moves away to have a relative displacement a therebetween. On the contrary, when the hinge returns to the closed state as shown in FIG. 3 from the open state as shown in FIG. 4, the first shaft 10 moves from the outer end of the up-inclined grooves 31 and 41 to the inner ends of the up-inclined grooves 31 and 41, and the second shaft 20 moves from the outer ends of the down-inclined grooves 32nd 42 to the inner ends of the up-inclined grooves 32 and 42 respectively.

Figure 5:
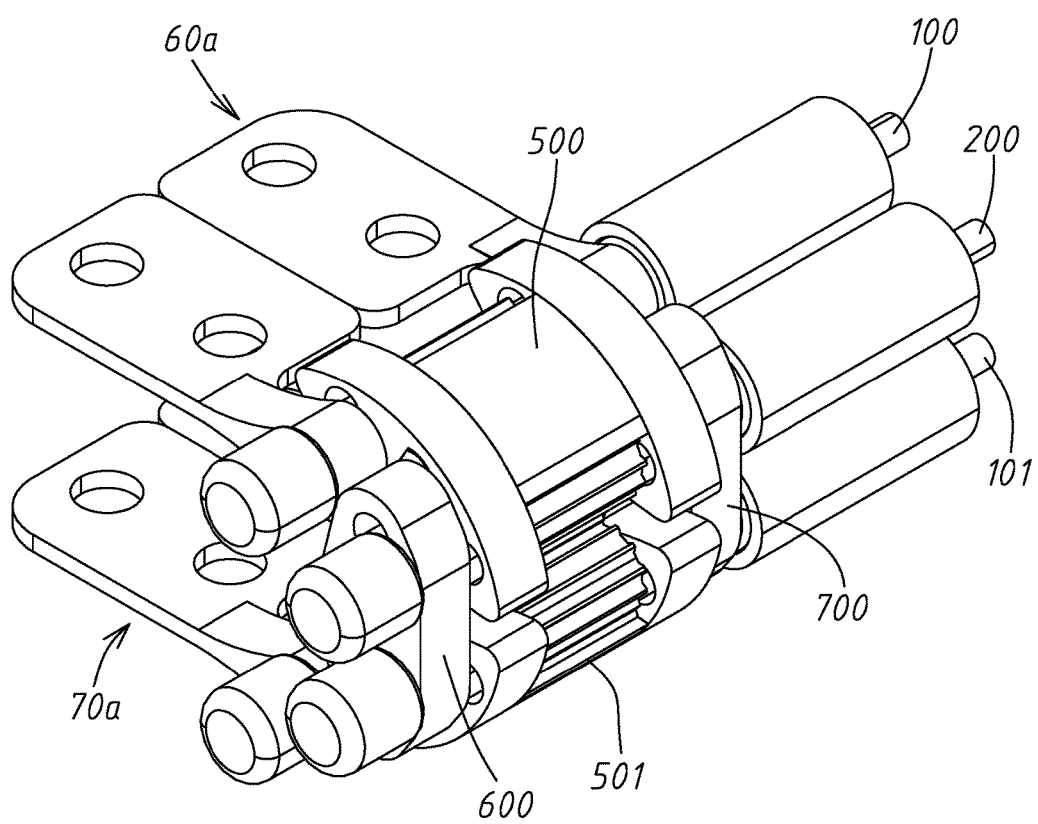
FIG. 5 is a perspective view of the second embodiment of a hinge of the invention.
Figure 6:
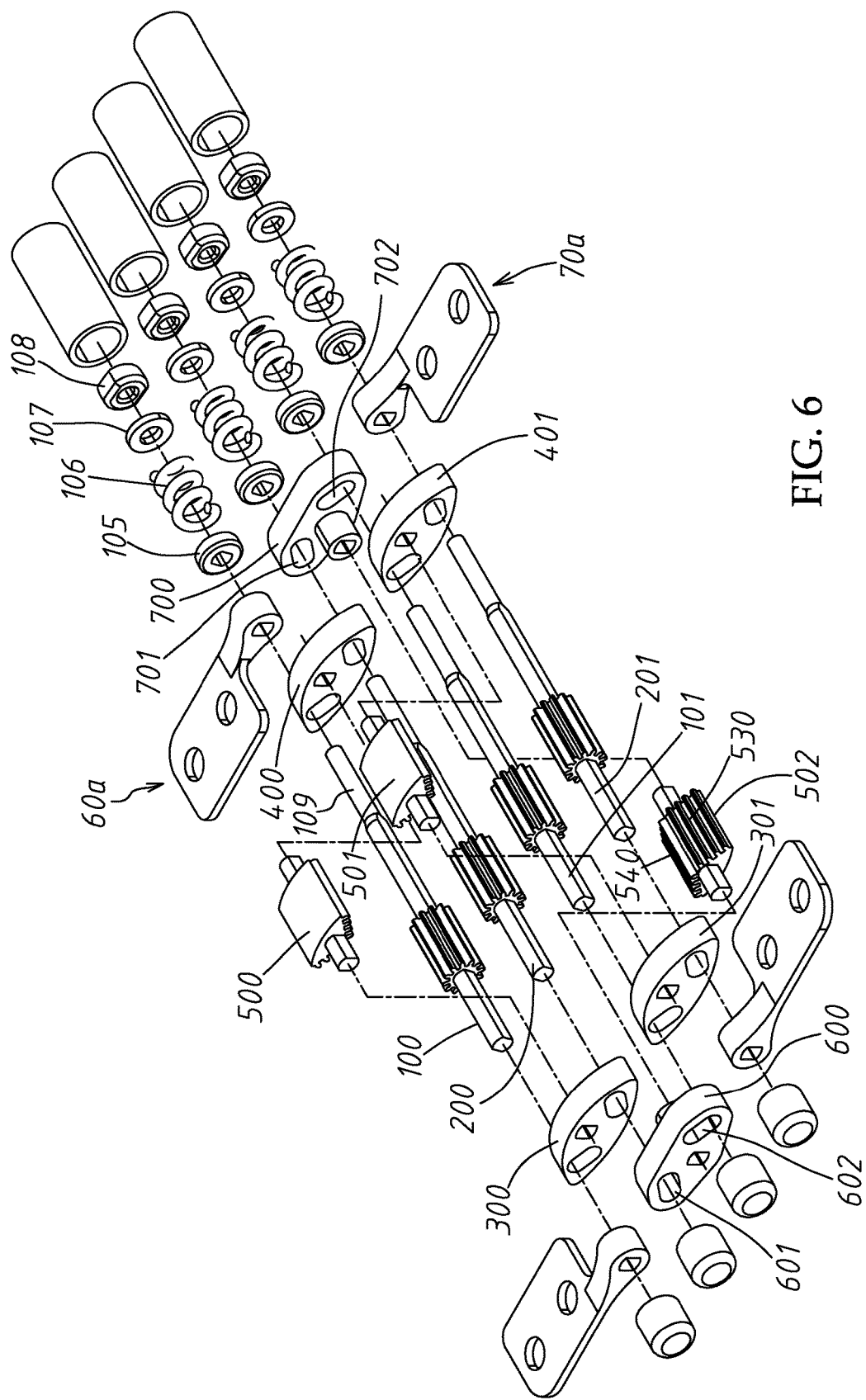
FIG. 6 is an exploded view of the hinge of FIG. 5.

Referring to FIGS. 5 and 6, the second embodiment of a hinge of the invention is shown. The hinge includes two first shafts 100 and 101, and two second shafts 200 and 201. The first shaft 100 and the second shaft 200 constitute a first shaft set, and the first shaft 101 and the second shaft 201 constitute a second shaft set. The first shaft set connects an upper plate 60a and the second shaft set connects a lower plate 70a, wherein the first shaft 100 connects the upper plate 60a and the second shaft 200 connects the lower plate 70a. The first shaft 100 and the second shaft 200 extend through the first guiding members 300 and the second guiding member 400 respectively. The first shaft 101 and the second shafts 201 extend through the first guiding member 301 and the second guiding member 401. A guiding base 500 is disposed between the first shaft 100 and the second shaft 200, and a guiding base 501 is disposed between the first shaft 101 and the second shaft 201. A an auxiliary guiding member 600 is disposed between the first guiding member 300 and the second guiding member 400, and an auxiliary guiding member 700 is disposed between the first guiding member 301 and the second guiding member 401. The auxiliary guiding members 600 has an up-inclined groove 601 and a down-inclined groove 602 and the auxiliary guiding member 700 has an up-inclined groove 701 and a down-inclined groove 702. In this embodiment, the second shaft 200 extends through the up-inclined grooves 601 and 701, and the first shaft 101 extends through the down-inclined grooves 602 and 702. A guiding base 502 having a first row of teeth 530 and a second row of teeth 540 transmits the movement of the first shaft set to the second shaft set. In this embodiment, the first shafts 100 and 101 and the second shafts 200 and 201 have extending rods 109 for mounting torque elastic members including a washer 105, a spring 106, a washer 107 and a bolt 108. The hinge further includes sleeves covering the first shafts 100 and 101 and the second shaft 200 and 201.

Figure 7:
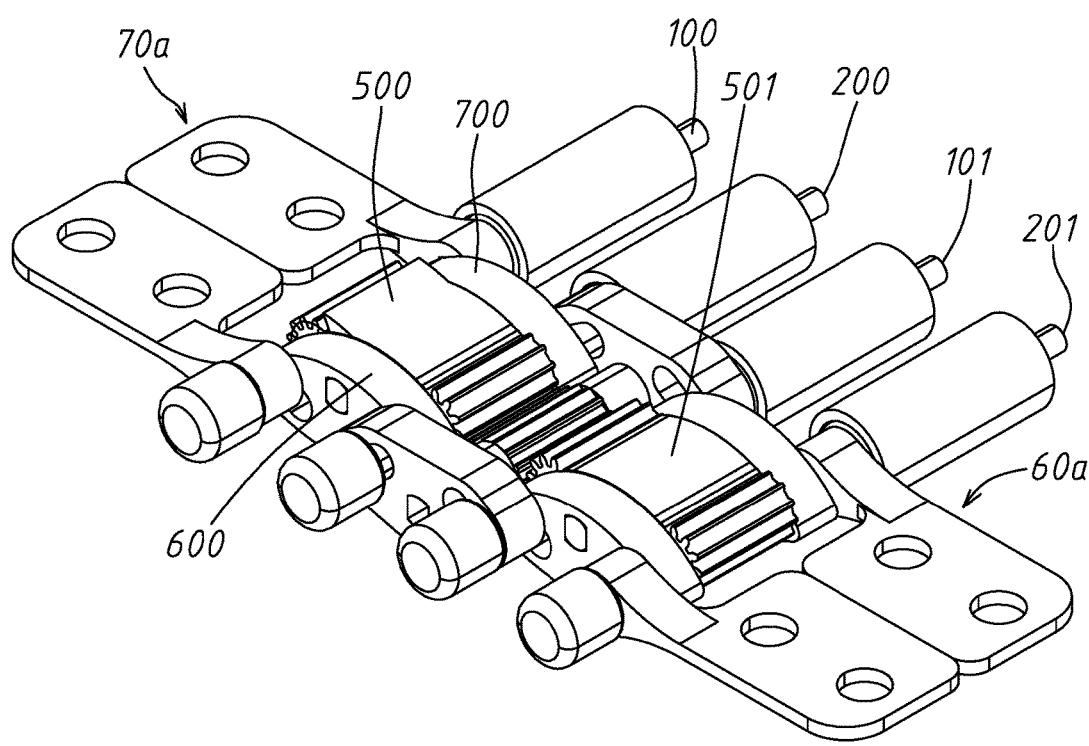
FIG. 7 depicts the hinge of FIG. 5 in an opened state.
Figure 8:
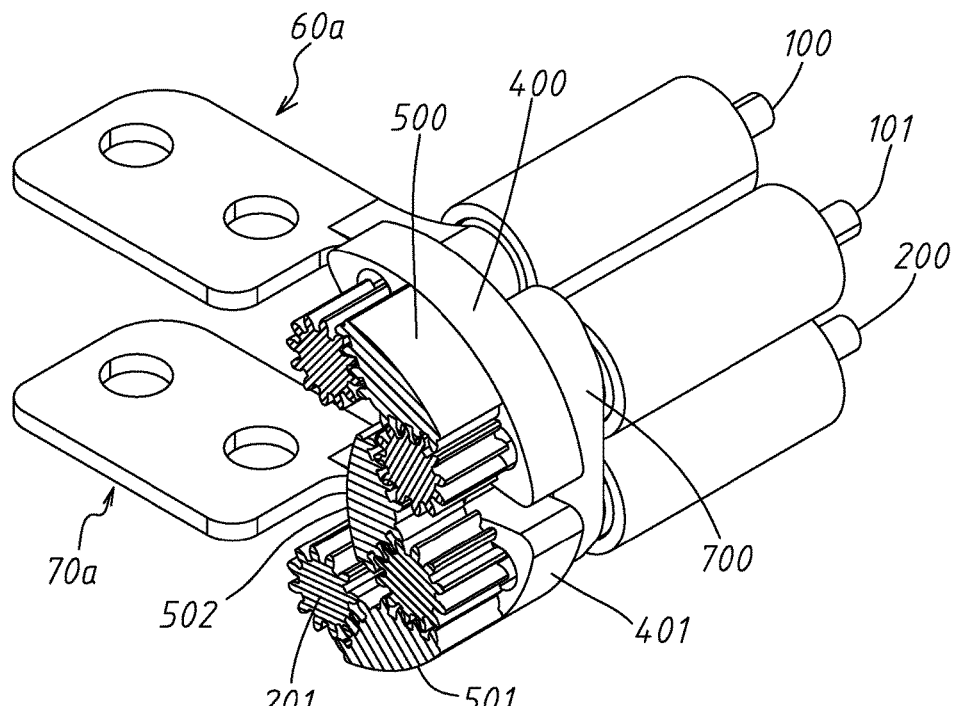
FIG. 8 is a cross section of a transmission mechanism of the hinge of FIG. 5.
Figure 9:
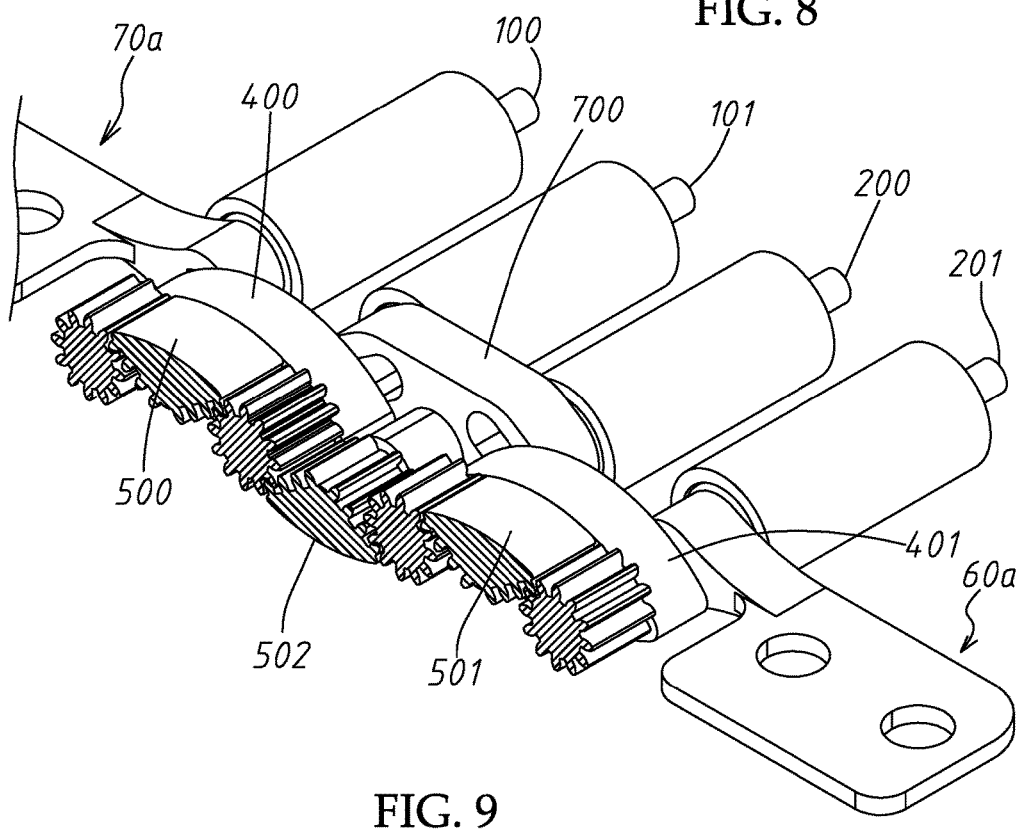
FIG. 9 is a cross section of the transmission mechanism of FIG. 8.

Referring to FIGS. 7 to 9, the first shaft 100 and the second shaft 200 move relative to each other, and the first shaft 101 and the second shaft 201 move relative to each other. The first shaft set including the first shaft 100 and the second shaft 200 move relative to the second shaft set including the first shaft 101 and the second shaft 201. In addition, movement of the first shaft set is transmitted to the second shaft set through the guiding base 502. Therefore, the hinge with multiple shafts can be applied to various electronic devices.

The shafts of the hinge of the invention are mounted to an electronic device and move relative to each other to prevent deformation or damage of display when the display and the main body of the electronic device rotate relative to each other.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A hinge, comprising:
a first shaft mounted to an upper plate and comprising a first gear and a first rod extending from the first gear;
a second shaft mounted to a lower plate and comprising a second gear and a second rod extending from the second gear;
a first guiding member, through which the first rod and the second rod extend, comprising a first up-inclined groove having a predetermined length and a first down-inclined groove having a predetermined length;

a second guiding member disposed on the first rod and the second rod and comprising a second up-inclined groove having a predetermined length and a second down-inclined groove having a predetermined length;

a guiding base disposed between the first shaft and the second shaft, mounted to the first guiding member and the second guiding member and comprising a first row of teeth engaging the first gear and a second row of teeth engaging the second gear, wherein the first rod extends through the first up-inclined groove and the second up-inclined groove to connect the upper plate, and the second rod extends through the first down-inclined groove and the second down-inclined groove to connect the lower plate.

2. The hinge as claimed in claim 1, wherein the first row of teeth has a slope identical to a slope of the first up-inclined groove and the second up-inclined groove, and the second row of teeth has a slope identical to a slope of the first down-inclined groove and the second down-inclined groove.

3. The hinge as claimed in claim 2, wherein the guiding base comprises two extending rods, and the first guiding member comprises a hole into which one of the extending rods is inserted, and the second guiding member comprises a hole into which the other extending rod is inserted.

4. The hinge as claimed in claim 1, wherein the guiding base comprises two extending rods, and the first guiding member comprises a hole into which one of the extending rods is inserted, and the second guiding member comprises a hole into which the other extending rod is inserted.

5. The hinge as claimed in claim 1, wherein the upper plate comprises two plates, and the lower plate comprises two plates, and each of the plates comprises a hole and an extending portion having a through hole, and the first rod is inserted into the through holes of the upper plate, and the second rod is inserted into the through holes of the lower plate.

6. The hinge as claimed in claim 1, wherein the first shaft further comprises an extending rod on which torque elastic members are mounted, and the second shaft further comprises an extending rod on which torque elastic members are mounted.

7. A hinge, comprising:

at least two shaft sets connecting an upper plate and a lower plate, each of the shaft set comprises a first shaft and a second shaft, wherein the first shaft comprises a first gear and a first rod extending from the first gear, and the second shaft comprises a second gear and a second rod extending from the second gear;

a first guiding member, through which the first rod and the second rod extend, comprising a first up-inclined groove having a predetermined length and a first down-inclined groove having a predetermined length; and a second guiding member, through which the first rod and the second rod extend, comprising a second up-inclined groove having a predetermined length and a second down-inclined groove having a predetermined length;

a first guiding base disposed between the first shaft and the second shaft, mounted to the first guiding member and the second guiding member and comprising a first row of teeth engaging the first gear and a second row of teeth engaging the second gear;

an auxiliary guiding member disposed between the first guiding member and the second guiding member and comprising an up-inclined groove through which the first shaft extends and a down-inclined groove through which the second shaft extend; and a second guiding base disposed between the shaft sets and comprising a first row of teeth and a second row of teeth, wherein the second guiding base transmits movement of the first shaft set to the second shaft set.

8. The hinge as claimed in claim 7, wherein the first row of teeth has a slope identical to a slope of the first up-inclined groove and the second up-inclined groove, and the second row of teeth has a slope identical to a slope of the first down-inclined groove and the second down-inclined groove.

9. The hinge as claimed in claim 8, wherein the guiding base comprises two extending rods, and the first guiding member comprises a hole into which one of the extending rods is inserted, and the second guiding member comprises a hole into which the other extending rod is inserted.

10. The hinge as claimed in claim 9, wherein the guiding base comprises two extending rods, and the first guiding member comprises a hole into which one of the extending rods is inserted, and the second guiding member comprises a hole into which the other extending rod is inserted.

11. The hinge as claimed in claim 7, wherein the upper plate comprises two plates, and the lower plate comprises two plates, and each of the plates comprises a hole and an extending portion having a through hole, and the first rod is inserted into the through hole of the upper plate, and the second rod is inserted into the through hole of the lower plate.

12. The hinge as claimed in claim 7, wherein the first shaft further comprises an extending rod for mounting torque elastic members, and the second shaft further comprises an extending rod for mounting torque elastic members.

* * * * *